United States Patent [19]

Ozawa

[11] 3,731,151

[45] May 1, 1973

[54] PROTECTIVE CIRCUIT

[75] Inventor: Akio Ozawa, Tokyo, Japan

[73] Assignee: Pioneer Electronic Corporation, Tokyo, Japan

[22] Filed: Nov. 16, 1971

[21] Appl. No.: 199,208

[30] Foreign Application Priority Data

Nov. 16, 1970 Japan..........................45/113493

[52] U.S. Cl. ...............317/27 R, 317/33 R, 307/202, 330/207 P, 317/33 VR

[51] Int. Cl. ..............................................H02h 3/28

[58] Field of Search..........................330/207 P, 30 D; 307/202, 235; 317/27 R, 33 R, 33 VR, 33 SC, 12 A, 12 R, 12 B; 323/DIG. 1, 22 T; 340/248 A, 248 E, 248 F, 253 A, 253 H, 253 N

[56] References Cited

UNITED STATES PATENTS

| | | | |
|---|---|---|---|
| 3,250,981 | 5/1966 | Marks | 317/33 X |
| 3,219,911 | 11/1965 | Burfeindt | 323/9 |
| 3,497,794 | 2/1970 | Frederickson | 323/DIG. 1 |
| 3,058,036 | 10/1962 | Reuther | 317/33 VR |
| 3,486,128 | 12/1969 | Lohrmann | 330/30 D |
| 3,550,025 | 12/1970 | Stodolsky | 330/51 |

*Primary Examiner*—Gerald Goldberg
*Assistant Examiner*—Harvey Fendelman
*Attorney*—Richard C. Sughrue et al.

[57] ABSTRACT

A protective circuit for protecting an output circuit and a load circuit of a signal amplifier from abnormal conditions, and including a differential amplifier for detecting the abnormal conditions of and a clipping circuit clipping a signal applied to one of the input terminals of the differential amplifier higher than a predetermined voltage.

3 Claims, 1 Drawing Figure

PATENTED MAY 1 1973 3,731,151
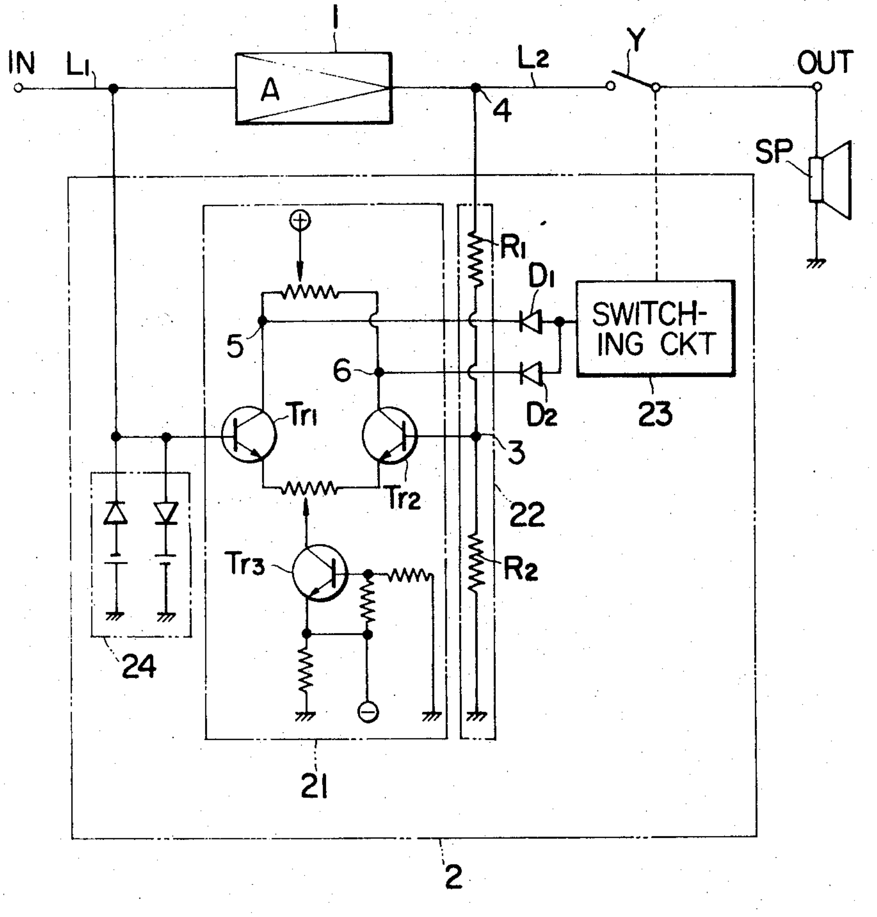
INVENTOR
AKIO OZAWA
BY Sughrue, Rothwell, Mion, Zinn & Macpeak
ATTORNEYS

PROTECTIVE CIRCUIT

BACKGROUND OF THE INVENTION

1. Field of the Invention

This invention relates to a protective circuit for protecting an output circuit and/or a load circuit from abnormal conditions, and more particularly to a protective circuit useful for an output-condenser-less (O.C.L.) amplifier.

2. Description of the Prior Art

In prior art, most audio amplifiers have been an output-transformerless (O.T.L.) amplifier. However, as an amplifier having better performance was demanded, it was recognized that the output condenser of an O.T.L. amplifier adversely affects the output signal. Consequently, an O.T.L. amplifier without an output condenser and having two power sources, i.e. an O.C.L. amplifier, has attracted notice recently. In this O.C.L. amplifier, an output terminal is connected directly to a load circuit without going through an output condenser. Consequently, when the D.C. voltage level of the output signal line varies, a direct current in accordance with the variation of the D.C. voltage flows into the load circuit. As a result, the load circuit, such as a loudspeaker, etc., is broken down by the direct current at times. On the other hand, active electrical devices of an output stage, for example output transistors, are broken down in the event of a short in the load circuit at times. The O.C.L. amplifier needs greater care than the O.T.L. amplifier with an output condenser in respect to providing protection for the amplifiers and the loads.

SUMMARY OF THE INVENTION

The present invention has been made to take care of afore-mentioned defects.

One object of the invention is to provide a protective circuit for securely protecting an output circuit and/or a load circuit from abnormal conditions, such as a short in the load circuit or a variation of the D.C. voltage in the circuit.

Another object of the invention is to provide a protective circuit which never reduces the safety operating range of an amplifier, in which range the amplifier operates originally, because of the addition of the protective circuit to the amplifier.

A further object of the invention is to provide a protective circuit useful for an O.C.L. amplifier.

Other objects, advantages and features of the present invention will become apparent from the following description taken in conjunction with the accompanying drawings.

BRIEF DESCRIPTION OF THE DRAWING

The single FIGURE is a circuit diagram showing one embodiment of a protective circuit in accordance with the present invention.

DESCRIPTION OF THE PREFERRED EMBODIMENT

One embodiment of this invention will be explained in accordance with the drawing.

An O.C.L. amplifier 1 has two power sources, that is a positive power source (+) and a negative power source (−). An input terminal IN and an output terminal OUT are connected to the O.C.L. amplifier 1 via an input-signal line L1 and an output-signal line L2, respectively. These signal lines L1 and L2 are normally at ground potential with respect to a direct current. In this embodiment, the input signal and the output signal of the O.C.L. amplifier 1 are in phase to each other. A loudspeaker SP is connected between the output terminal OUT and ground.

A protective circuit 2 for the amplifier 1 and the loudspeaker SP consists of a differential amplifier 21, an attenuator 22, a switching circuit 23, clipping circuit 24 and a switch contact *y* in series with output line L2. The differential amplifier 21 includes transistors Tr1, Tr2 and Tr3. The base electrodes of the transistors Tr1 and Tr2 are connected with the input-signal line L1 and an output terminal 3 of the attenuator 23, respectively. The transistor Tr3 functions as a constant-current circuit. Both the transistors Tr1 and Tr2 are normally in a balanced state.

The attenuator 22 has an attenuation factor of the same magnitude as the amplification factor of the amplifier 1. An input terminal 4 and output terminal 3 of the attenuator are connected to the output-signal line L2 and the base electrode of the transistor Tr2, respectively. In this embodiment, the attenuator 22 is formed by resistors R1 and R2. The switching circuit 23 is connected to output terminals of the differential amplifier 21 via diodes D1 and D2, and is operative to open the contact *y* when either output voltage of the differential amplifier 21 becomes lower than a predetermined voltage. In addition, the switching circuit 23 is designed so as to hold the contact *y* in the open state for a few seconds after it has been opened.

A clipping circuit 24 is connected between ground and the base electrode of transistor Tr1, this base being one input terminal of the differential amplifier 21. The clipping circuit clips the input signal applied to the differential amplifier 21 at the same time and same manner as the output signal from the amplifier 1 is clipped. The clipping level of the clipping circuit is designed to make the signal being fed the base of the transistor Tr1 equal to the signal being fed the base of the transistor Tr2 in the state when the output signal from the amplifier 1 is being clipped.

Next, the operation of the protective circuit 2 will be explained. Normally, the base electrodes of the transistor Tr1 and Tr2 are at ground potential, the differential amplifier 21 is in a balanced state, and the witching circuit 23 is not operated, whereby contact *y* is closed.

In this normal state, when a signal is applied to the input terminal IN, part of the signal is applied to the O.C.L. amplifier 1, and another part is applied to the base electrode of the transistor Tr1 in the differential amplifier 21. The signal applied to the amplifier 1 is amplified by a settled amplification factor. Part of the amplified signal drives the loudspeaker SP via the contact *y*, and another part is applied to the attenuator 22. The applied signal is attenuated by an attenuating factor of the same magnitude as the amplification factor of the amplifier 1, and the attenuated signal is applied to the base electrode of the transistor Tr2 via attenuator output terminal 3. Since the signals fed to the bases of the transistors Tr1 and Tr2 are in phase with each other and are of the same magnitude, the differential amplifier 21 remains in the balanced state.

On the other hand, when the D.C. potential of the output-signal line L2 varies due to some disorder of the amplifier 1, the base voltage of the transistor Tr2 varies in accordance with the variation of the D.C. potential of the output signal line L2. Consequently, the differential amplifier 21 goes into an unbalanced state to produce an output signal of which operates the switching circuit 23. The operation of the switching circuit 23 opens contact *y* so that the load circuit, i.e. the loudspeaker SP, is protected from the disorder of the amplifier 1.

Moreover, when the terminals of the loudspeaker are short-circuited due to some cause, an A.C. signal does not appear on the output signal line L2. Consequently, the differential amplifier 21 will again go into the unbalanced state as same described above, whereby switching circuit 23 is operated to open the contact *y* so that the amplifier is protected securely from the disorder of the load circuit. In addition, the switching circuit 23, once operated, returns to its original non-operated state after a few seconds, at which time the contact *y* is closed again. At this time, if the differential amplifier 21 is still in the unbalanced state, the contact *y* is opened again; consequently, the amplifier 1 or loudspeaker SP is again securely protected from any disorder.

When an input signal is so excessive that the output signal from the amplifier 1 is clipped, if it were not for the clipping circuit 24, the differential amplifier 21 would go into the unbalanced state. However, by the operation of the clipping circuit 24, the input signal being fed the base of the transistor Tr1 is also clipped during the time period when the output signal from the amplifier 1 is clipped; therefore, the differential amplifier is still retained in the balanced state, and the loudspeaker SP is driven as before.

In the one embodiment described above, the attenuator having an attenuation factor of the same magnitude as the amplification factor of the amplifier 1 is used to equate the input voltages of both the input terminals of the differential amplifier 21. This invention, is not, however, limited to this embodiment alone. Another object of this invention is to broadly protect the amplifier or the load by using the output of the differential amplifier. This invention is not limited at all as to the way in which this output is used. That is, the controlling circuit is not limited by this example, but may be a well-known circuit which is operated by the output of the abnormal condition detecting circuit to protect the amplifier or the load. For example, he source may be opened by the controlling circuit and the contact *y* in the output line is not necessarily required.

The protective circuit according to the present invention, as set forth above, is a circuit operated when a differential amplifier turns into the unbalanced state due to some disorders, consequently, an amplifier and/or load circuit is protected securely from an overload and/or from a variation of the D.C. voltage of the amplifier.

While the invention has been particularly shown and described with reference to the preferred embodiment thereof, it will be understood by those skilled in the art that various changes in form and details may be made therein without departing from the spirit and scope of the invention.

I claim:

1. A protective circuit for protecting an output stage of a signal amplifier comprising:

a. a normally balanced differential amplifier having a first input coupled to the input of, and a second input coupled to the output of, said signal amplifier, said differential amplifier being responsive to an abnormal condition of said signal amplifier to go into an unbalanced state to produce a control signal at its output, b. normally unoperated switching means connected to the output of said differential amplifier and operative to protect the output stage of said signal amplifier from abnormal conditions, said switching means being operated by said control signal when said differential amplifier goes into an unbalanced state, c. a clipping circuit connected between said input of said signal amplifier and said first input of said differential amplifier for clipping a signal applied to said first input of said differential amplifier, and d. an attenuation circuit having an input connected to said output of said signal amplifier and having an output connected to said second input of said differential amplifier, said attenuation circuit having an attenuation factor of the same magnitude as the amplification factor of said signal amplifier.

2. A protective circuit as set forth in claim 1, wherein said switching means comprises a switching circuit having a switch contact in the output of said signal amplifier.

3. A protective circuit as set forth in claim 1, wherein said signal amplifier is an output-condenser-less amplifier.

* * * * *